United States Patent Office 3,205,157
Patented Sept. 7, 1965

3,205,157
ELECTROMAGNETIC RADIATION POLYMERIZATION

James J. Licari, Whittier, and Philip C. Crepeau, Buena Park, Calif., assignors to North American Aviation, Inc.

No Drawing. Filed Mar. 13, 1962, Ser. No. 179,469
11 Claims. (Cl. 204—158)

This invention relates to a process for effecting the photopolymerization of epoxy type resins and more particularly to a process for effecting the photopolymerization of epoxy type resins by use of organic compounds that are photosensitive and release an active catalyst upon exposure to radiation.

Polymerization is presently being accomplished by heating resins, in which a chemical compound has been incorporated, until catalysts contained therein are activated. These methods, though successful, are unsatisfactory in that careful attention must be given to stay within temperature limitations of the system involved. For example, if a circuit board containing components were coated with an epoxy type resin the curing temperature would have to be maintained below the maximum temperatures at which permanent damage would be incurred by the board or component. In order to prevent the harmful effects of heat curing, it is often necessary to extend the curing cycle an unreasonable length of time.

Applicants' method eliminates heat as a curing agent, thereby achieving an optimum polymerization cycle and minimizing the harmful effects of excessive temperature.

Applicants' method comprises steps for incorporating a photosensitive compound into an epoxy type resin system and then, after applying the mixture to a surface area, exposing the mixture to electromagnetic radiation of appropriate intensity and frequency to cause the photosensitive compound inside the resin to decompose and release a catalytic agent. The agent catalyzes the cross linking of the resin system.

It is therefore an object of this invention to provide an improved method for effecting polymerization of epoxy type resins by use of a photosensitive compound and electromagnetic radiation.

It is a further object of this invention to avoid the harmful effects of heat curing in the polymerization of epoxy type resins.

In carrying out the method of this invention, a photosensitive compound such as aryl diazonium fluoroborate of the types I or II shown below is first prepared in solution form by mixing the compound with a solvent such as acetone. For example, benzene diazonium fluoroborate might be prepared.

Type I

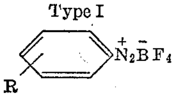

Type II

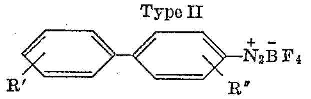

R, R′, R″ may be hydrogen, alkyl, aryl, halogen, nitro, sulfonyl, or a combination of these groups. The process for forming and preparing the photosensitive organic compounds, supra, forms no part of this process inasmuch as preparation of such compounds is well-known in the art.

The exact amount of solvent necessary will depend on the compound used. The solvent is used in sufficient quantity to dissolve all the compounds. The amount of photosensitive compound need not be specifically ascertained but must be related to the amount of epoxy resin to be polymerized. Best results are obtained by using one to ten parts by weight of the photosensitive compound to each one hundred (100) parts by weight of the epoxy type resin. The resin might be of the type derived from the diglycidyl ether of bisphenol A, epoxidized polyolefins, or epoxylated novalacs, although any epoxy type resin is satisfactory.

After the solution containing the aryl diazonium fluoroborate is introduced into the epoxy type resin the resulting mixture is applied to a surface. The surface, for example, might be that of a circuit board or that surrounding a component. In certain instances, it might be necessary, before exposing the surface to radiation, to shield various areas thereof. This is accomplished by masking predetermined portions of the surface with a layer of material having substantial opacity to prevent radiation from reaching the surface areas not requiring polymerization. To accomplish such masking, for example, a film developed to a predetermined pattern may be placed on top of the surface. The radiation will penetrate the clear areas and cause polymerization. The opaque areas will block the radiation.

After the surface has been properly masked, it is exposed to electromagnetic radiation. The radiation imparts energy to the resin system in sufficient quantity to cause the photosensitive compound, which may be for example, an aryl diazonium fluoroborate compound, to decompose and release a catalyst. If a specific type of aryl diazonium fluoroborate compound were used, for example benzene diazonium fluoroborate, boron trifluoride ($BF_3$) would be released when the decomposition level of the compound is reached. The $BF_3$ would catalyze the cross linking of the epoxy type resin. The mechanism exemplifying such a release is shown below.

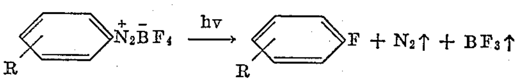

where R is defined supra.

Instrumentation means such as a Ken Rad 100 watt ultraviolet lamp might be employed as a radiation source for the purpose of imparting energy to the resin system, although any similar instrument could be used as well. The only limitation placed on the type of instrumentation used is that it must have a frequency range and an energy level sufficient to impart to the resin system energy at a high enough intensity to reach the decomposition level of the photosensitive compounds. It might be necessary to vary the frequency and/or energy of the instrument until decomposition begins. For example, if six (6) p.b.w. (parts by weight) of the benzene diazonium fluoroborate were combined with 100 p.b.w. of Epon 828, the Ken Rad 100 watt lamp, when placed approximately six inches from the surface, would cause decomposition at 3660 Angstroms. Decomposition of the compound or the effects thereof are determined by measuring the change in the insulation resistance or appearance of the surface. This may be accomplished by connecting a megohm bridge to two separate points on the surface. Whenever decomposition begins the electrical resistance of the surface increases with time until polymerization is complete. For example, using the radiation instrument, composition and procedure set forth above, the resistance might be found to change from approximately $5\times10^6$ ohms to $1.7\times10^{11}$ ohms over a period of approximately ten (10) minutes.

Once polymerization has been completed, the radiation source is turned off and the resistance measuring device is removed. A time range for polymerization may be established by use of a resistance bridge as enumerated above or from prior experience.

After the exposure to radiation has been completed, the shielding, if any, is removed and the surface is bathed in a solvent such as a chlorinated solvent or ketone to remove the unpolymerized or shielded areas of the surface. After the bathing, the polymerization process is completed, and the surface is ready for use.

Although the invention has been described and illustrated in detail, it is to be understood that the same is by way of illustration and example only and is not to be taken by way of limitation, the spirit and scope of this invention being limited only by the terms of the appended claims.

We claim:

1. A method for effecting polymerization of epoxy resins comprising the steps of mixing with said epoxy resin the photosensitive compound aryl diazonium fluoroborate selected from the group consisting of compounds having the formula:

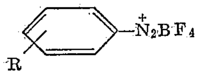

and

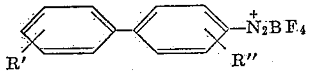

wherein R, R' and R'' are selected from the class consisting of hydrogen alkyl, aryl, halogen, nitro, and sulfonyl, and exposing the mixture to electromagnetic radiation of predetermined intensity and frequency until the photosensitive compound decomposes causing simultaneous curing in the absence of heating of said epoxy resin.

2. The process as set forth in claim 1 in which said mixture comprises one to ten parts by weight of said photosensitive organic compound and one hundred parts by weight of said epoxy resin.

3. The process as set forth in claim 1 in which said mixture comprises substantially six parts by weight of said photosensitive organic compound and one hundred parts by weight of said epoxy resin.

4. A method for effecting polymerization of epoxy resins comprising the steps of mixing the photosensitive compound benzene diazonium fluoroborate with an epoxy resin, and exposing predetermined portions of the mixture to electromagnetic radiation of predetermined intensity and frequency until said photosensitive compound decomposes causing simultaneous curing in the absence of heating of said epoxy resin.

5. The process as set forth in claim 4 in which said mixture comprises one to ten parts by weight of said photosensitive organic compound and one hundred parts by weight of said epoxy resin.

6. The process as set forth in claim 4 in which said mixture comprises substantially six parts by weight of said photosensitive organic compound and one hundred parts by weight of said epoxy resin.

7. A process for polymerization of epoxy resins; said process comprising the steps of mixing with the epoxy resin aryl diazonium fluoroborate selected from the group consisting of compounds having the formula:

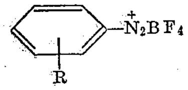

and

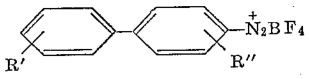

wherein R, R' and R'' are selected from a class consisting of hydrogen alkyl, aryl, halogen, nitro, sulfonyl, applying said mixture onto a surface area, shielding predetermined portions of said shielded area, exposing said unshielded surface area to electromagnetic radiation from an electromagnetic radiation source displaced from said surface area by a predetermined distance and having a predetermined frequency and energy output range, measuring the degree of polymerization while exposing said area to radiation, cutting off said electromagnetic radiation when polymerization as measured is complete, whereby polymerization is effected in the absence of heating, removing said sheilding means, and applying a suitable solvent for removal of unpolymerized portions of said mixture.

8. The process as set forth in claim 7 in which said mixture comprises four to eight parts by weight of said photosensitive organic compound and one hundred parts by weight of said epoxy resin.

9. The process as set forth in claim 7 in which said mixture comprises substantially six parts by weight of said photosensitive organic compound and one hundred parts by weight of said epoxy resin.

10. A process for polymerization of epoxy resins; said process comprising the steps of mixing with the epoxy resin a quantity of benzene diazonium fluoroborate, applying said mixture onto a surface area, shielding predetermined portions of said surface area, exposing said unshielded surface area to electromagnetic radiation from an electromagnetic radiation source displaced from said surface area by a predetermined distance and having a predetermined frequency and energy output range, measuring the degree of polymerization while exposing said surface area to radiation, cutting off said electromagnetic radiation when polymerization as measured is complete, whereby polymerization is effected in the absence of heating, removing said shielding means, and applying a suitable solvent for removal of unpolymmerized portions of said mixture.

11. The process as set forth in claim 10 in which said mixture comprises substantially six parts by weight of said photosensitive organic compound and one hundred parts by weight of said epoxy resin.

References Cited by the Examiner

UNITED STATES PATENTS

| | | | |
|---|---|---|---|
| 2,213,423 | 9/40 | Wiezevich | 204—162 |
| 2,959,531 | 11/60 | Wheelock | 204—158 |
| 3,074,869 | 1/63 | Workman | 204—158 |

MURRAY TILLMAN, *Primary Examiner.*

J. R. SPECK, *Examiner.*